United States Patent
Park et al.

(10) Patent No.: US 9,947,459 B2
(45) Date of Patent: Apr. 17, 2018

(54) SURFACE MOUNTED ELECTRONIC COMPONENT

(71) Applicant: SAMSUNG ELECTRO-MECHANICS CO., LTD., Suwon-Si, Gyeonggi-Do (KR)

(72) Inventors: Heung Kil Park, Suwon-Si (KR); Sang Soo Park, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/956,302

(22) Filed: Dec. 1, 2015

(65) Prior Publication Data
US 2016/0219739 A1    Jul. 28, 2016

(30) Foreign Application Priority Data
Jan. 27, 2015   (KR) .......................... 10-2015-0012642

(51) Int. Cl.
*H05K 7/00* (2006.01)
*H01F 27/29* (2006.01)
(Continued)

(52) U.S. Cl.
CPC ....... *H01F 27/292* (2013.01); *H01F 17/0013* (2013.01); *H01G 2/06* (2013.01);
(Continued)

(58) Field of Classification Search
CPC H01G 4/30; H01G 4/232; H01G 4/40; H01G 4/38; H05K 1/0231;
(Continued)

(56) References Cited

U.S. PATENT DOCUMENTS 5,367,437 A  * 11/1994 Anderson ................ H01G 4/38
                                                         257/533
6,304,425 B1    10/2001 Mamada
(Continued)

FOREIGN PATENT DOCUMENTS

JP          3035492 B2     4/2000
JP          2013-030746 A  2/2013
(Continued)

*Primary Examiner* — James Wu
(74) *Attorney, Agent, or Firm* — McDermott Will & Emery LLP

(57) ABSTRACT

A surface mounted electronic component includes a first frame terminal including a first end surface frame extending in a first direction and first upper and lower surface frames extending from upper and lower ends of the first end surface frame in a second direction; a second frame terminal including a second end surface frame opposing the first end surface frame and extending in the first direction and second upper and lower surface frames extending from upper and lower ends of the second end surface frame in a third direction opposite to the second direction; a first electronic component disposed between the first and second end surface frames below the first and second upper surface frames; and a second electronic component disposed on the first and second upper surface frames.

13 Claims, 17 Drawing Sheets

(51) Int. Cl.
  *H01G 4/30*     (2006.01)
  *H01G 4/40*     (2006.01)
  *H01F 17/00*    (2006.01)
  *H01G 4/38*     (2006.01)
  *H01G 2/06*     (2006.01)
  *H01G 4/228*    (2006.01)
  *H01G 4/248*    (2006.01)
  *H05K 1/02*     (2006.01)
  *H05K 7/02*     (2006.01)
  *H01G 4/12*     (2006.01)

(52) U.S. Cl.
  CPC ............. *H01G 4/228* (2013.01); *H01G 4/248* (2013.01); *H01G 4/30* (2013.01); *H01G 4/38* (2013.01); *H01G 4/40* (2013.01); *H01G 4/12* (2013.01); *H05K 1/0231* (2013.01); *H05K 7/023* (2013.01)

(58) Field of Classification Search
  CPC .......... H05K 2201/10515; H05K 7/023; H01F 27/292; H01F 17/0013
  USPC ... 361/790, 735, 321.2, 306.3, 301.4, 308.1, 361/310
  See application file for complete search history.

(56) References Cited

U.S. PATENT DOCUMENTS

| | | | |
|---|---|---|---|
| 6,903,920 B1* | 6/2005 | Prymak .................. | H01G 2/065 361/306.1 |
| 2001/0001258 A1* | 5/2001 | Ishigaki ................. | H01G 4/232 361/502 |
| 2008/0239621 A1* | 10/2008 | Tajuddin .................. | H01G 2/06 361/306.1 |
| 2011/0056735 A1* | 3/2011 | Lee ........................ | H01G 4/005 174/260 |
| 2012/0326569 A1 | 12/2012 | Itagaki et al. | |
| 2013/0020913 A1* | 1/2013 | Shirakawa ............... | H01G 4/30 310/364 |

FOREIGN PATENT DOCUMENTS

| | | |
|---|---|---|
| KR | 2000-0047547 A | 7/2000 |
| KR | 10-1018646 B1 | 3/2011 |

\* cited by examiner

SURFACE MOUNTED ELECTRONIC COMPONENT

CROSS-REFERENCE TO RELATED APPLICATION

This application claims the benefit of priority to Korean Patent Application No. 10-2015-0012642, filed on Jan. 27, 2015 with the Korean Intellectual Property Office, the entirety of which is incorporated herein by reference.

BACKGROUND

The present disclosure relates to a surface mounted electronic component and a board having the same.

Electronic components using ceramic material, such as capacitors, inductors, piezoelectric elements, varistors, thermistors, or the like, include a ceramic body formed of a ceramic material, internal electrodes formed in the ceramic body, and external electrodes mounted on surfaces of the ceramic body so as to be connected to the internal electrodes.

Among ceramic electronic components, a multilayer ceramic capacitor includes a plurality of stacked dielectric layers, internal electrodes disposed to face each other with each of the dielectric layers interposed therebetween, and external electrodes electrically connected to the internal electrodes.

SUMMARY

An aspect of the present disclosure may provide a surface mounted electronic component capable of having high durability and high reliability against heat and mechanical stress.

According to an aspect of the present disclosure, a surface mounted electronic component comprises a first frame terminal including a first end surface frame extending in a first direction and first upper and lower surface frames extending from upper and lower ends of the first end surface frame in a second direction; a second frame terminal including a second end surface frame opposing the first end surface frame and extending in the first direction and second upper and lower surface frames extending from upper and lower ends of the second end surface frame in a third direction opposite to the second direction; a first electronic component disposed between the first and second end surface frames below the first and second upper surface frames; and a second electronic component disposed on the first and second upper surface frames.

The first and second electronic components may each include ceramic bodies and external electrodes disposed on outer surfaces of the ceramic bodies, the external electrodes of the first and second electronic components being electrically connected to the first or second upper surface frame.

The external electrodes of the first and second electronic components may be electrically connected to the first or second upper surface frame through a conductive adhesive.

The first and second electronic components may each include ceramic bodies in which dielectric layers and internal electrodes are alternately stacked, and external electrodes disposed on outer surfaces of the ceramic bodies and connected to the internal electrodes, the internal electrodes of the first and second electronic components being disposed perpendicularly to a mounting surface.

The internal electrodes of the first electronic component may extend to an upper surface of the ceramic body, and the internal electrodes of the second electronic component may extend to a lower surface of the ceramic body.

The first and second electronic components may each include ceramic bodies in which dielectric layers and internal electrodes are alternately stacked, and external electrodes disposed on outer surfaces of the ceramic bodies and connected to the internal electrodes, the internal electrodes of the first and second electronic components being disposed in parallel with a mounting surface.

The first and second electronic components may each include ceramic bodies in which dielectric layers and internal electrodes are alternately stacked, and external electrodes disposed on outer surfaces of the ceramic bodies and connected to the internal electrodes, the internal electrodes of the first electronic component being disposed perpendicularly to amounting surface and the internal electrodes of the second electronic component being disposed in parallel with the mounting surface.

The internal electrodes of the first electronic component may extend to an upper surface of the ceramic body.

The external electrodes of the first electronic component may be connected to the internal electrodes on an upper surface of the ceramic body.

The surface mounted electronic component may further comprise a molding part enclosing the first and second electronic components.

The first and second electronic components may be provided in plural.

A plurality of the first electronic components may be connected to each other in parallel.

The first and second frame terminals may be provided with metal films disposed on surfaces of the first and second frame terminals, respectively.

According to another aspect of the present disclosure, a surface mounted electronic component comprises a first electronic component; a second electronic component disposed above the first electronic component; and a pair of frame terminals connected to the first and second electronic components, wherein first ends of the frame terminals are disposed between the first and second electronic components, and second ends of the frame terminals are disposed below the first electronic component.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
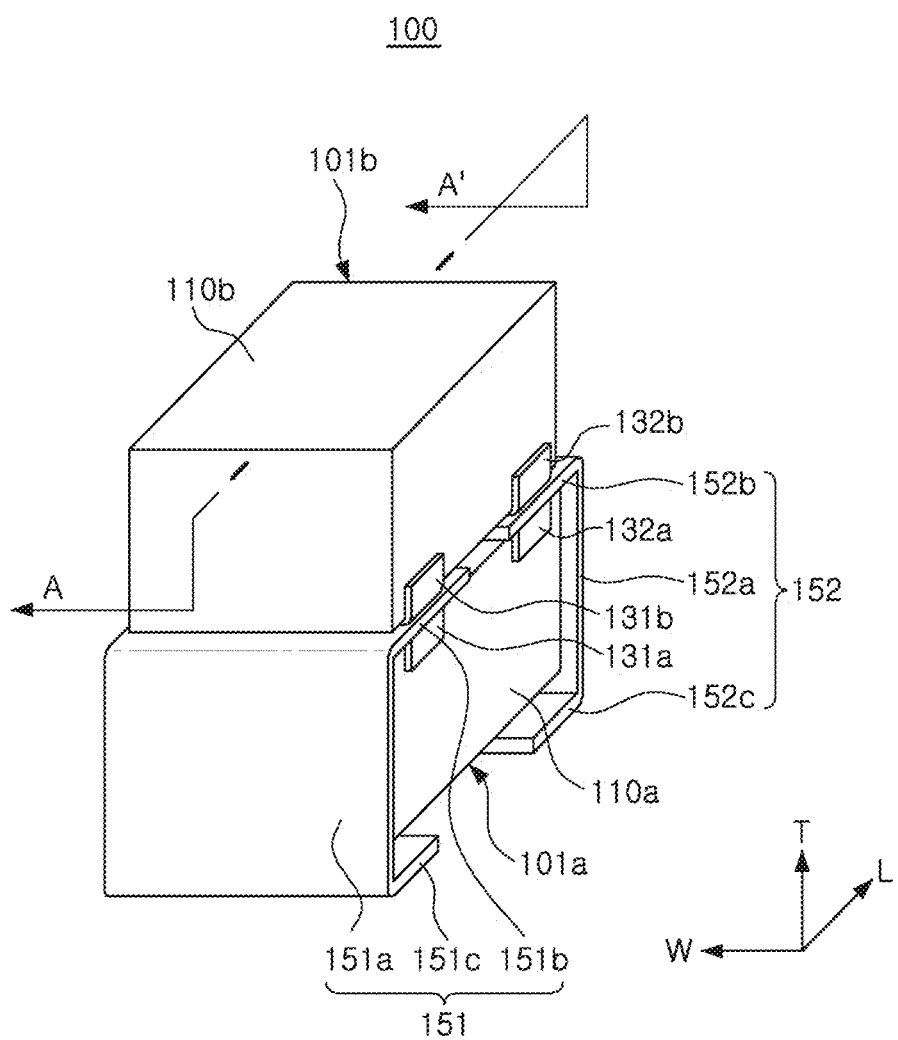
FIG. 1 is a schematic perspective view illustrating a surface mounted electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Surface Mounted Electronic Component

A surface mounted electronic component, according to an exemplary embodiment, may include first and second electronic components that are perpendicularly disposed, and a pair of frame terminals connected to the first and second electronic components.

The first and second electronic components may be disposed so that the first electronic component is positioned below, and the second electronic component is positioned on the first electronic component.

The pair of frame terminals may include first and second frame terminals, wherein first ends of the first and second frame terminals may be disposed between the first and second electronic components and second ends of the first and second frame terminals may be disposed below the first electronic component.

The first and second frame terminals may have a bent shape so that first ends thereof may be disposed between the first and second electronic components and second ends thereof may be disposed below the first electronic component, and may include two or more bent portions, respectively.

In the surface mounted electronic component, according to the exemplary embodiment, the first and second frame terminals may absorb mechanical stress to prevent the electronic components connected to the frame terminals from being damaged, and if the electronic components have a piezoelectric property, the frame terminals may absorb and decrease mechanical vibrations, thereby decreasing acoustic noise.

Further, since heat generated in the electronic components is radiated through the frame terminals, an increase in temperature of the electronic components may be suppressed.

The first and second electronic components may be disposed with first ends of the frame terminals interposed therebetween, and thus a mounting area may be decreased, and in a case in which the first and second electronic components are disposed to face each other with first ends of the frame terminals interposed therebetween, current maybe uniformly supplied to the electronic components through the frame terminals, whereby heat generation due to the current is not concentrated in a specific electronic component, and thus reliability may be improved.

The first and second electronic components may be one or more of a multilayer ceramic capacitor and an inductor.

Figure 2:
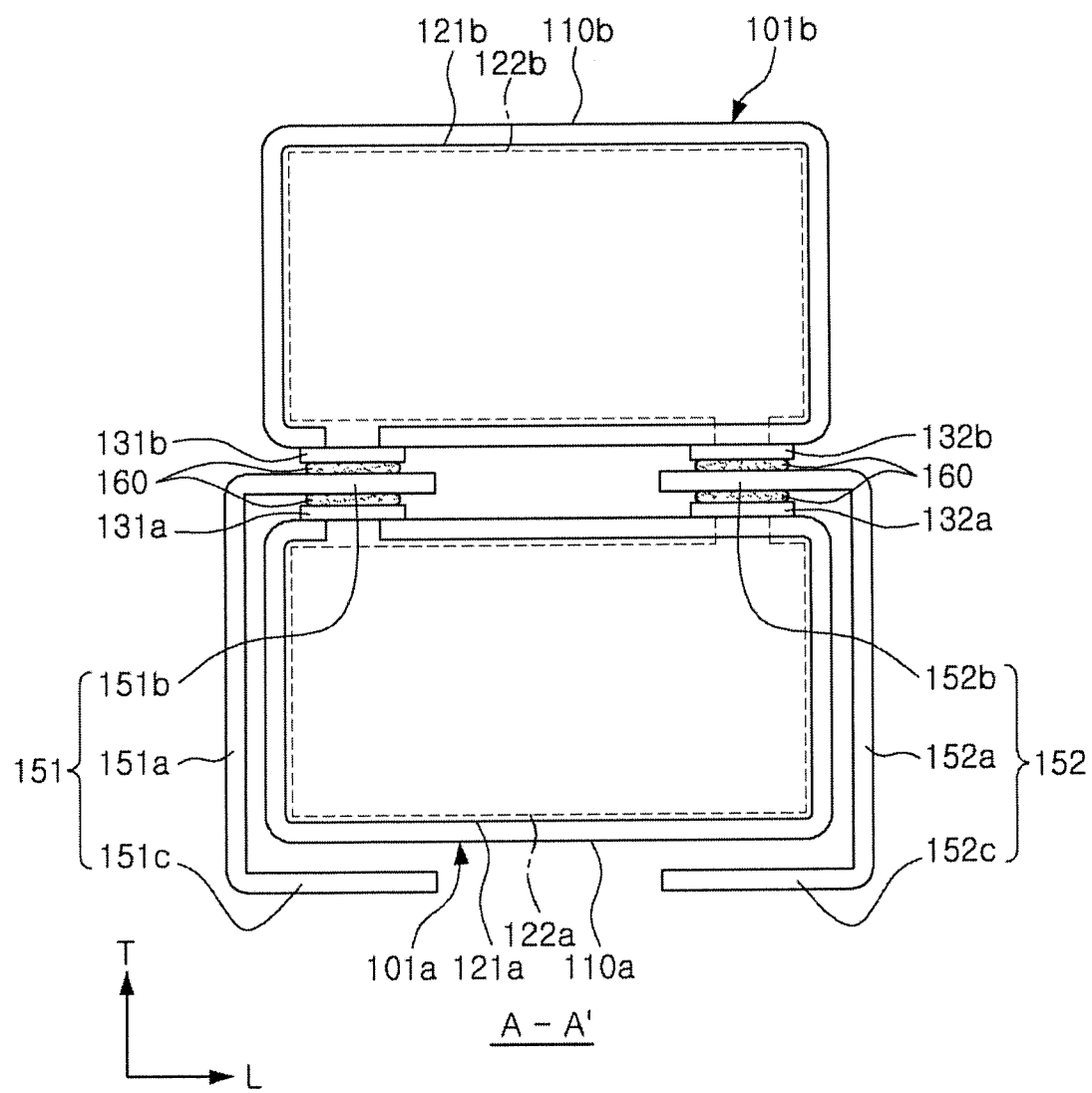
FIG. 2 is a cross-sectional view taken along line A-A' of FIG. 1.

FIG. 1 is a schematic perspective view illustrating a surface mounted electronic component according to an exemplary embodiment, and FIG. 2 is a cross-sectional view taken along line A-A' of FIG. 1.

Directions will be defined in order to clearly describe exemplary embodiments. "L," "W," and "T" illustrated in the accompanying drawings refer to a length direction, a width direction, and a thickness direction of the ceramic body, respectively. Here, the thickness direction may be the same as a direction perpendicular to a mounting surface of the surface mounted electronic component.

In addition, in the present exemplary embodiment, for convenience of explanation, surfaces of ceramic bodies included in the surface mounted electronic component opposing each other in the thickness direction will be defined as upper and lower surfaces.

Referring to FIGS. 1 and 2, the surface mounted electronic component may include first and second electronic components 101a and 101b; and first and second frame terminals 151 and 152.

The first frame terminal 151 may include a first end surface frame 151a extending in a first direction, a first upper surface frame 151b extending from an upper end of the first end surface frame in a second direction, and a first lower surface frame 151c extending from a lower end of the first end surface frame in the second direction, and the second frame terminal 152 may include a second end surface frame 152a opposing the first end surface frame and extending in the first direction, a second upper surface frame 152b extending from an upper end of the second end surface frame in a third direction opposing the second direction, and a second lower surface frame 152c extending from a lower end of the second end surface frame in the third direction.

The first direction may be defined as the direction perpendicular to the mounting surface. In addition, the first direction may refer to a thickness direction of a ceramic body.

The second direction may refer to one direction substantially perpendicular to the first direction, and the third direction may be defined as a direction substantially perpendicular to the first direction but opposing the second direction.

According to the exemplary embodiment, the first and second frame terminals 151 and 152 may have bent portions at the upper and lower ends of the first and second end surface frames 151a and 152a.

For example, the first and second frame terminals 151 and 152 may have a " ⊏ " shape and be disposed so that the end portions of the first and second frame terminals oppose each other, respectively.

The first electronic component 101a may be disposed between the first and second end surface frames 151a and 152a below the first and second upper surface frames 151b and 152b, and the second electronic component 101b may be disposed on the first and second upper surface frames 151b and 152b.

The first and second electronic components 101a and 101b may include ceramic bodies 110a and 110b and first and second external electrodes 131a and 132a, and 131b and 132b disposed on outer surfaces of the ceramic bodies, respectively, and the first and second external electrodes 131a, 132a, 131b, and 132b of the first and second electronic components may be connected to the first or second frame terminal 151 or 152.

For example, the first external electrode 131a of the first electronic component 101a and the first external electrode 131b of the second electronic component 101b may be connected to the first frame terminal 151, and the second external electrode 132a of the first electronic component 101a and the second external electrode 132b of the second electronic component 101b may be connected to the second frame terminal 152.

The first external electrode 131a of the first electronic component may be connected to a lower surface of the first upper surface frame 151b, and the second external electrode 132a of the first electronic component may be connected to a lower surface of the second upper surface frame 152b.

The first external electrode 131b of the second electronic component may be connected to an upper surface of the first upper surface frame 151b, and the second external electrode 132b of the second electronic component may be connected to an upper surface of the second upper surface frame 152b.

In this case, the external electrodes 131a, 132a, 131b, and 132b of the first and second electronic components and the terminal frames 151 and 152 may be electrically connected to each other through a conductive adhesive 160.

The conductive adhesive 160 may contain a high-temperature solder, a conductive resin paste, or the like, but a material of the conductive adhesive 160 is not limited thereto.

The first and second electronic components may be multilayer ceramic capacitors and may be first and second multilayer ceramic capacitors, respectively.

Since a configuration of the second multilayer ceramic capacitor is similar to that of the first multilayer ceramic capacitor, the first and second multilayer ceramic capacitors will be described together with each other, and when there is a difference therebetween, the difference will be separately described.

The multilayer ceramic capacitors 101a and 101b, according to the exemplary embodiment, may include the ceramic bodies 110a and 110b and the first and second external electrodes 131a and 132a, and 131b and 132b, respectively.

Figure 3:
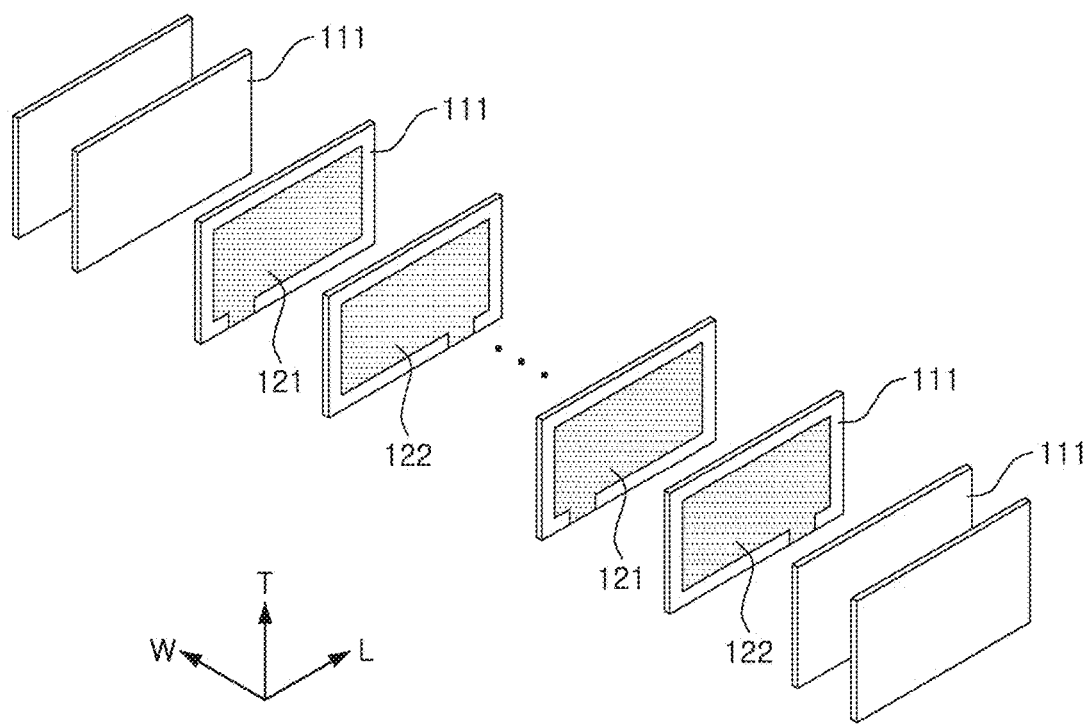
FIG. 3 is an exploded perspective view of a ceramic body included in a multilayer ceramic capacitor according to the exemplary embodiment in the present disclosure.

FIG. 3 is an exploded perspective view of the ceramic body of the multilayer ceramic capacitor according to the exemplary embodiment.

Referring to FIG. 3, according to the exemplary embodiment, the ceramic bodies 110a and 110b may be formed by stacking a plurality of dielectric layers 111 and sintering the stacked dielectric layers 111. In this case, a shape and a dimension of the ceramic bodies and the number of stacked dielectric layers 111 may be variously changed and are not limited to those of the present exemplary embodiment illustrated in FIG. 3.

In addition, the plurality of dielectric layers 111 configuring the ceramic body may be in a sintered state, and adjacent dielectric layers 111 may be integrated with each other so that boundaries therebetween are not readily apparent without a scanning electron microscope (SEM).

In this case, a thickness of the dielectric layer 111 may be optionally changed according to a capacitance design of the multilayer ceramic capacitor.

Further, the dielectric layers 111 may contain ceramic powder having high permittivity such as a barium titanate ($BaTiO_3$) based powder or a strontium titanate ($SrTiO_3$) based powder. However, a material of the dielectric layers 111 is not limited thereto.

First and second internal electrodes 121 and 122, which are electrodes having different polarities from each other, may be formed by printing a conductive paste containing a conductive metal on the dielectric layers 111 at a predetermined thickness.

In this case, the conductive metal contained in the conductive paste may be, for example, nickel (Ni), copper (Cu), palladium (Pd), or an alloy thereof. However, the conductive metal is not limited thereto.

Further, as a printing method of the conductive paste, a screen printing method, a gravure printing method, or the like, may be used. However, the printing method is not limited thereto.

The first and second internal electrodes 121 and 122 may be alternately stacked in the ceramic body to face each other in a stacking direction of the dielectric layers 111.

According to the exemplary embodiment, the dielectric layers 111 may be stacked in the width direction of the ceramic body.

In this case, the internal electrodes may be disposed perpendicularly to upper and lower surfaces of the ceramic body, and the first and second internal electrodes may extend to the upper or lower surface of the ceramic body.

According to the exemplary embodiment, first and second internal electrodes 121a and 122a of the first multilayer ceramic capacitor 101a may extend to an upper surface of the ceramic body 110a, and first and second internal electrodes 121b and 122b of the second multilayer ceramic capacitor 101b may extend to a lower surface of the ceramic body 110b.

Further, the first and second external electrodes 131a and 132a of the first multilayer ceramic capacitor 101a may be disposed on the upper surface of the ceramic body 110a to thereby be electrically connected to lead portions of the first and second internal electrodes 121a and 122a, and the first and second external electrodes 131b and 132b of the second multilayer ceramic capacitor 101b may be disposed on the lower surface of the ceramic body 110b to thereby be electrically connected to lead portions of the first and second internal electrodes 121b and 122b.

In a case in which the external electrodes 131a, 132a, 131b, and 132b of the first and second multilayer ceramic capacitors 101a and 101b are disposed on the upper or lower surface of the ceramic body 110a or 110b, a chip size of the surface mounted electronic component for capacitance may be decreased due to a decrease in an area of the external electrodes.

The first and second external electrodes 131a, 132a, 131b, and 132b of the first and second multilayer ceramic capacitors 101a and 101b may be extended from the upper or lower surface of the ceramic body 110a or 110b to both side surfaces of the ceramic body in the width direction by a predetermined length.

The external electrodes 131a, 132a, 131b, and 132b of the first and second multilayer ceramic capacitors 101a and 101b may be formed of a conductive paste containing a conductive metal.

Here, the conductive metal may be, for example, nickel (Ni), copper (Cu), palladium (Pd), gold (Au) or an alloy thereof. However, the conductive metal is not limited thereto.

The external electrodes 131a and 132a of the first multilayer ceramic capacitor 101a may be disposed on the upper surface of the ceramic body 110a, and the external electrodes 131b and 132b of the second multilayer ceramic capacitor 101b may be disposed on the lower surface of the ceramic body 110b, and thus the external electrodes 131a and 132a of the first multilayer ceramic capacitor 101a and the external electrodes 131b and 132b of the second multilayer ceramic capacitor 101b may be connected to the first and second upper surface frames 151b and 152b.

When the first and second electronic components 101a and 101b are disposed to be symmetrical to each other on and below the first and second upper surface frames 151b and 152b as in the present exemplary embodiment, current applied through the frame terminals may uniformly flow to the first and second electronic components, whereby heat generation due to the current is not concentrated in any one of the components, and thus reliability may be improved.

Further, when the external electrodes of the second electronic component 101b are disposed on the lower surface of the ceramic body, since electrodes are not disposed on an upper surface of the second electronic component, even though a metal shield or metal case contacts the upper surface of the second electronic component, a short circuit may not occur.

Further, the first and second frame terminals 151 and 152 may absorb mechanical stress to prevent the electronic components connected to the frame terminals from being damaged and to decrease acoustic noise.

Further, since heat generated in the electronic components is radiated through the frame terminals, deterioration of reliability due to an increase in temperature of the electronic components may be suppressed.

Modified Exemplary Embodiments

Hereinafter, modified exemplary embodiments will be described. Specifically, differences will be mainly described, and a description of contents overlapping contents of the surface mounted electronic component according to the exemplary embodiment described above will be omitted.

Figure 4:
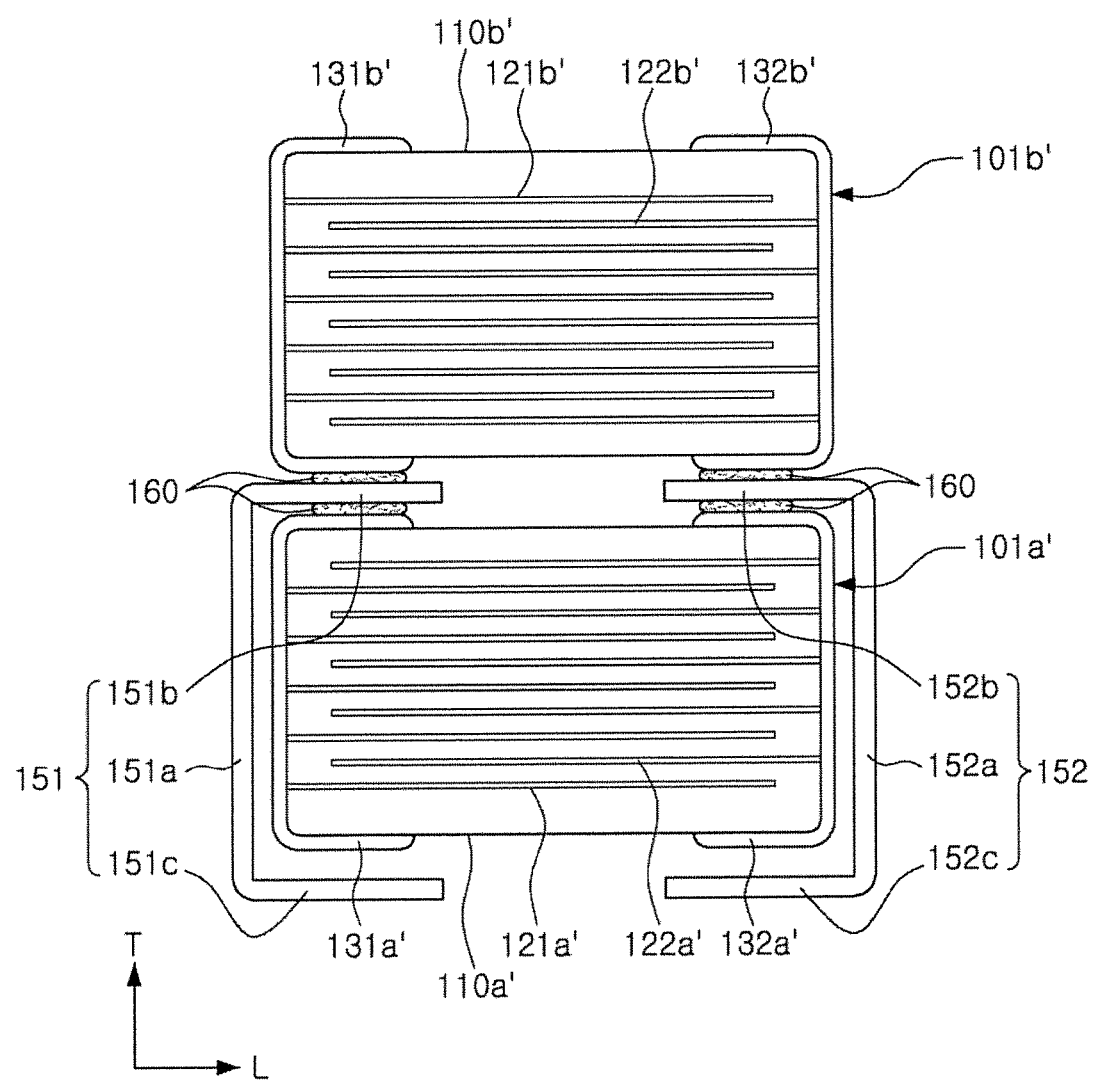
FIG. 4 is a cross-sectional view of a surface mounted electronic component according to a first modified exemplary embodiment in the present disclosure.

FIG. 4 is a cross-sectional view of a surface mounted electronic component according to a first modified exemplary embodiment.

Figure 5:
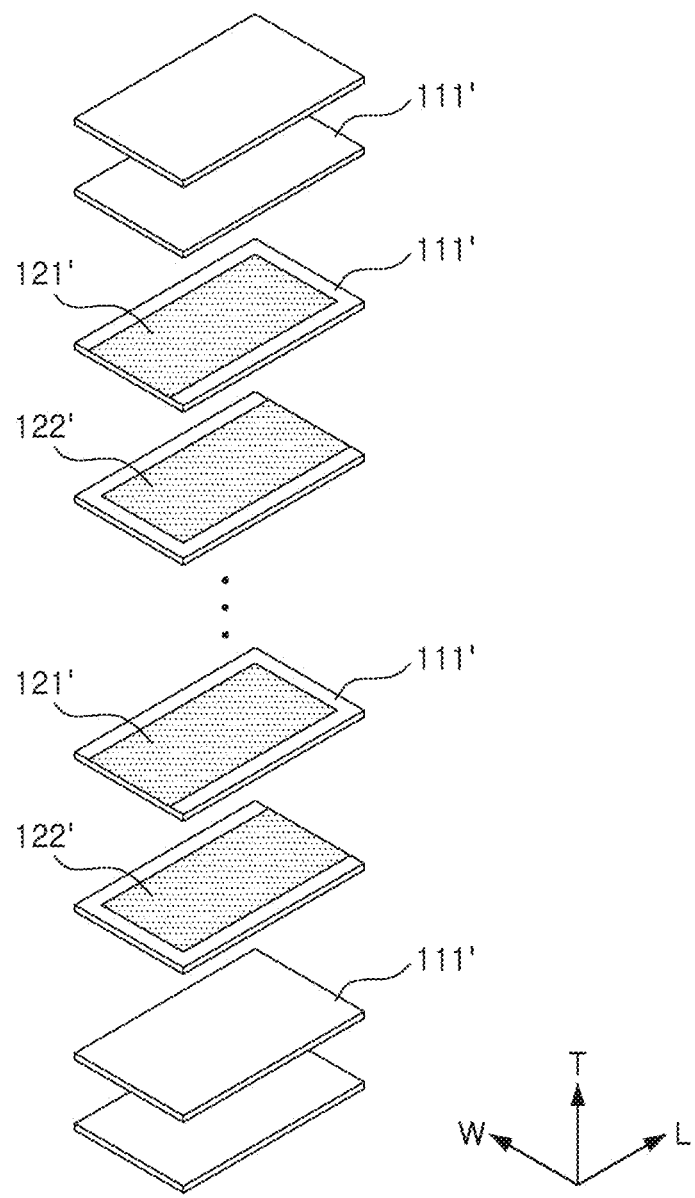
FIG. 5 is an exploded perspective view of a ceramic body included in a multilayer ceramic capacitor according to the first modified exemplary embodiment in the present disclosure.

Referring to FIG. 4, first and second electronic components 101a' and 101b' may be first and second multilayer ceramic capacitors, respectively. FIG. 5 is an exploded perspective view of a ceramic body included in the multilayer ceramic capacitor according to the first modified exemplary embodiment.

Referring to FIG. 5, dielectric layers 111' and internal electrodes 121' and 122' included in the first and second multilayer ceramic capacitors, according to the present modified exemplary embodiment, may be stacked in a thickness direction of the ceramic body 110'.

According to the present modified exemplary embodiment, internal electrodes 121a', 122a', 121b', and 122b' included in the first and second multilayer ceramic capacitors may be disposed in parallel with a mounting surface and led to both end surfaces of ceramic bodies 110a' and 110b' in a length direction.

First and second external electrodes 131a', 132a', 131b', and 132b' of the first and second multilayer ceramic capacitors may be disposed on both end surfaces of the ceramic bodies 110a' and 110b' in the length direction, respectively, to thereby be electrically connected to the first and second internal electrodes, and may be extended from both end surfaces of the ceramic bodies in the length direction to upper and lower surfaces of the ceramic bodies and both side surfaces of the ceramic bodies in the width direction to thereby be electrically connected to frame terminals 151 and 152.

Figure 6:
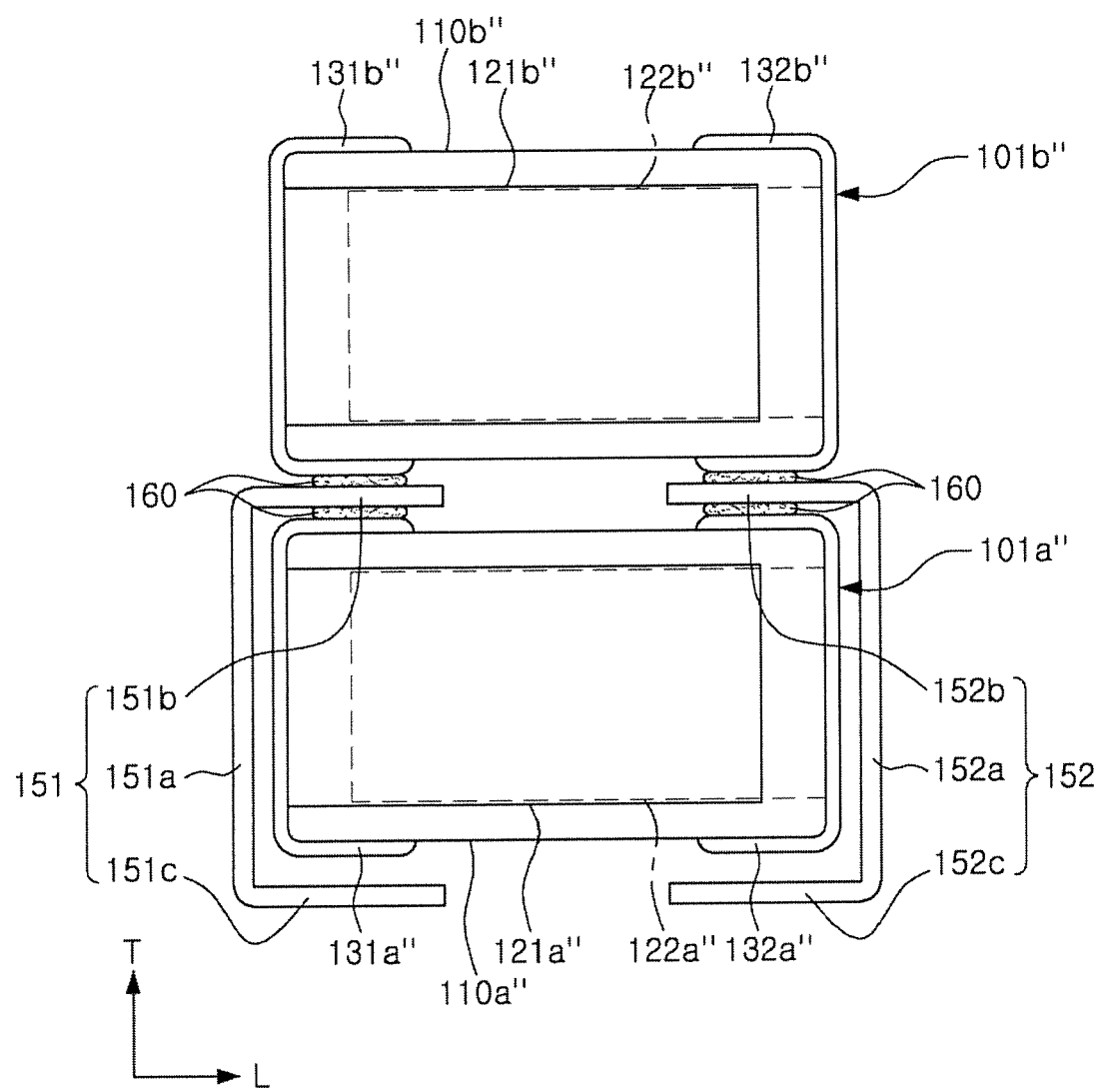
FIG. 6 is a cross-sectional view of a surface mounted electronic component according to a second modified exemplary embodiment in the present disclosure.

FIG. 6 is a cross-sectional view of a surface mounted electronic component according to a second modified exemplary embodiment.

Referring to FIG. 6, first and second electronic components 101a and 101b may be first and second multilayer ceramic capacitors, respectively.

Figure 7:
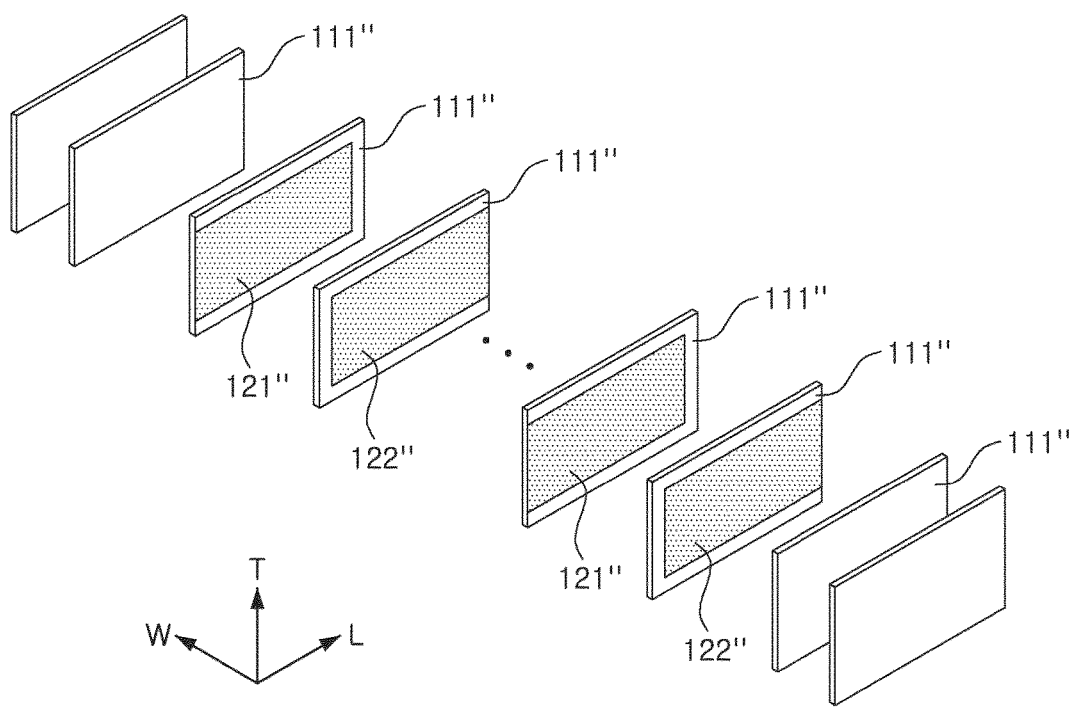
FIG. 7 is an exploded perspective view of a ceramic body included in a multilayer ceramic capacitor according to the second modified exemplary embodiment in the present disclosure.

FIG. 7 is an exploded perspective view of a ceramic body included in the multilayer ceramic capacitor according to the second modified exemplary embodiment.

Referring to FIGS. 6 and 7, dielectric layers 111" and internal electrodes 121" and 122" included in the first and second multilayer ceramic capacitors according to the present modified exemplary embodiment may be stacked in a width direction of the ceramic body 110".

According to the present modified exemplary embodiment, internal electrodes 121a", 122a", 121b", and 122b" included in the first and second multilayer ceramic capacitors may be disposed perpendicularly to a mounting surface and led to both end surfaces of ceramic bodies 110a" and 110b" in a length direction.

First and second external electrodes 131a", 132a", 131b", and 132b" of the first and second multilayer ceramic capacitors may be disposed on both end surfaces of the ceramic bodies 110a" and 110b" in the length direction, respectively, to thereby be electrically connected to the first and second internal electrodes, and may be extended from both end surfaces of the ceramic bodies in the length direction to upper and lower surfaces of the ceramic bodies and both side surfaces of the ceramic bodies in the width direction to thereby be electrically connected to frame terminals 151 and 152.

As in the first and second modified exemplary embodiments, when the ceramic capacitors perpendicularly disposed with first and second upper surfaces frame 151b and 152b interposed therebetween face each other in the same mounting direction as each other, phases of piezoelectric vibrations in each of the ceramic capacitors may be opposite each other, and thus the piezoelectric vibrations of upper and lower ceramic capacitors may offset each other, and thus, acoustic noise may be decreased.

Figure 8:
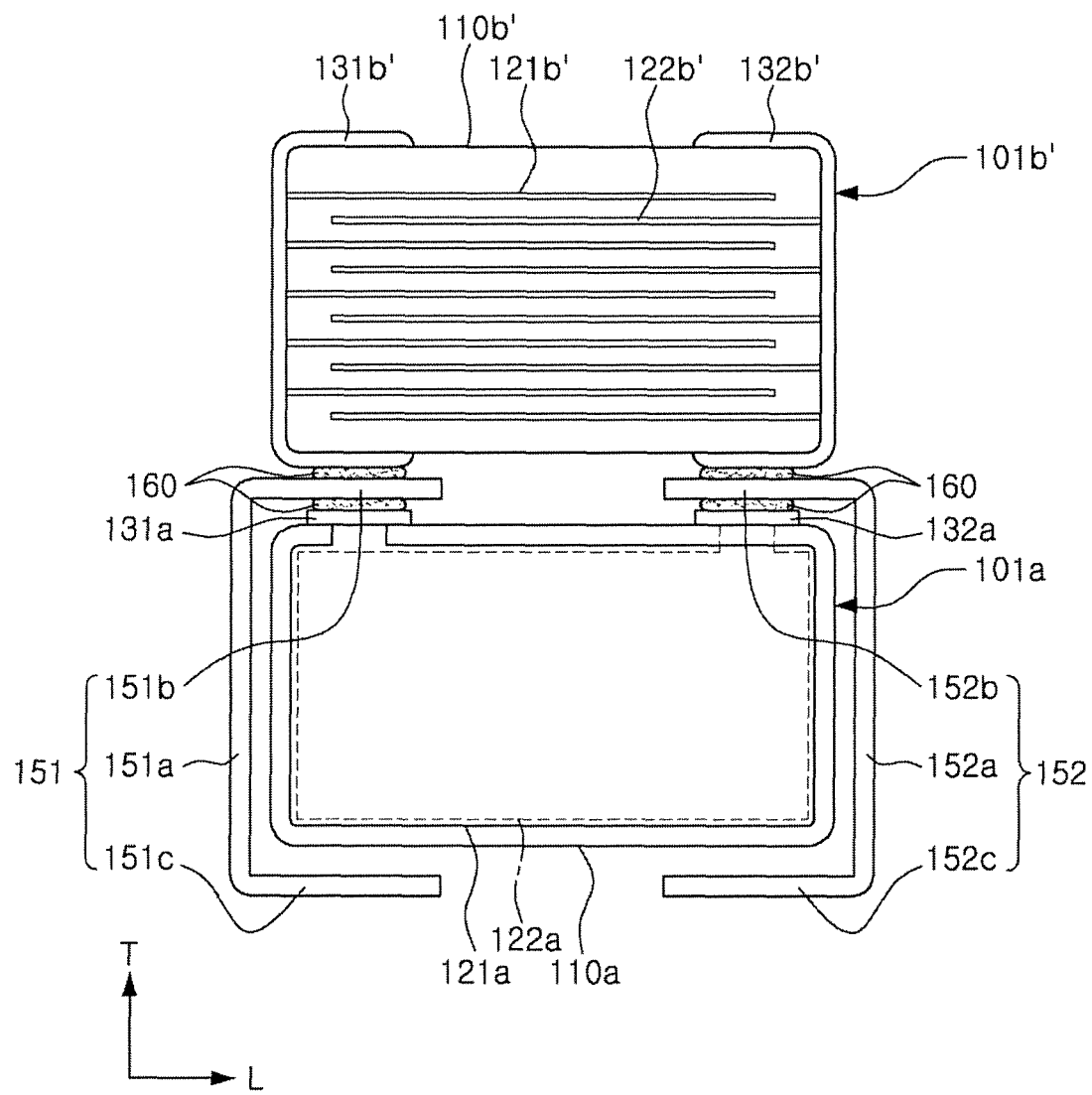
FIG. 8 is a cross-sectional view of a surface mounted electronic component according to a third modified exemplary embodiment in the present disclosure.

FIG. 8 is a cross-sectional view of a surface mounted electronic component according to a third modified exemplary embodiment.

Referring to FIG. 8, a first electronic component 101a, according to the present modified exemplary embodiment, is a multilayer ceramic electronic component in which internal electrodes 121a and 122a are disposed perpendicularly to a mounting surface thereof, and a second electronic component 101b is a multilayer ceramic electronic component in which internal electrodes 121b' and 122b' are disposed in parallel with a mounting surface thereof.

For example, the first electronic component may be the same as the first multilayer ceramic capacitor according to the exemplary embodiment described above, and the second electronic component may be the same as the second multilayer ceramic capacitor according to the first modified exemplary embodiment described above.

Figure 9:
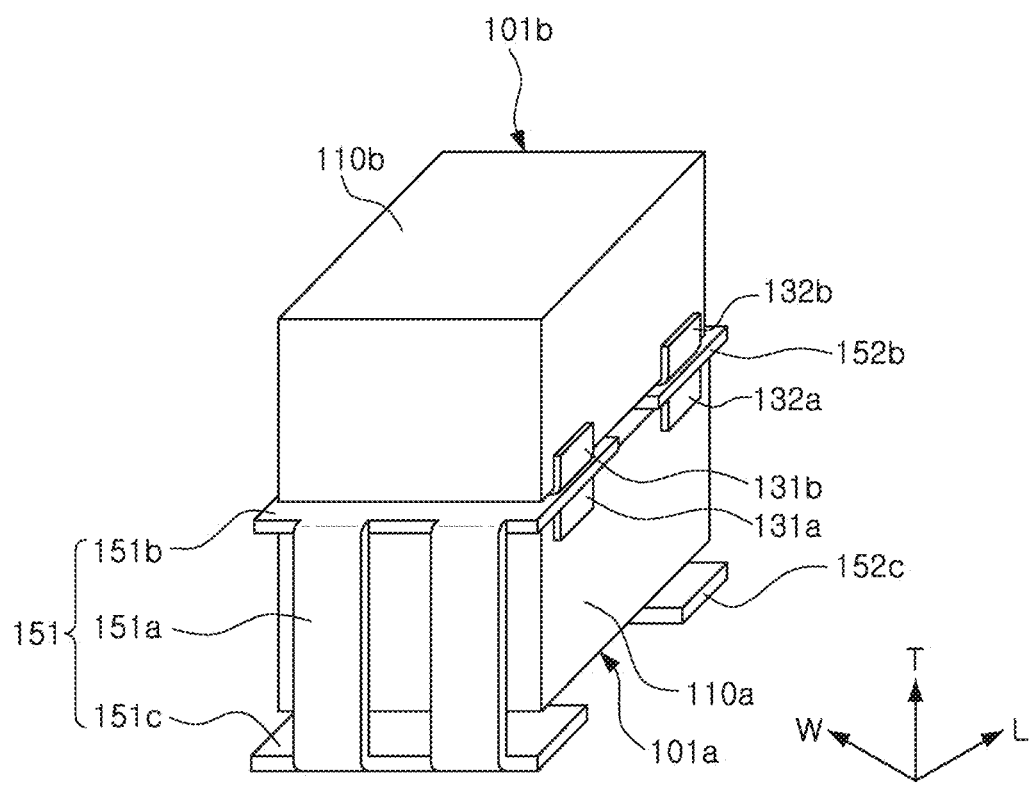
FIG. 9 is a perspective view of a surface mounted electronic component according to a fourth modified exemplary embodiment in the present disclosure.

FIG. 9 is a perspective view of a surface mounted electronic component according to a fourth modified exemplary embodiment.

As illustrated in FIG. 9, according to the present modified exemplary embodiment, first and second end surface frames 151a and 152a may be formed to have a width narrower than that of first and second upper surface frames 151b and 152b or first and second lower surface frames 151c and 152c. In addition, as illustrated in FIG. 9, some regions of the first and second end surface frames 151a and 152a may be removed, and thus the first and second end surface frames 151a and 152a may have at least two divided regions.

In a case in which areas of the first and second end surface frames 151a and 152a are decreased as in the present modified exemplary embodiment, acoustic noise may be more effectively decreased.

Figure 10:
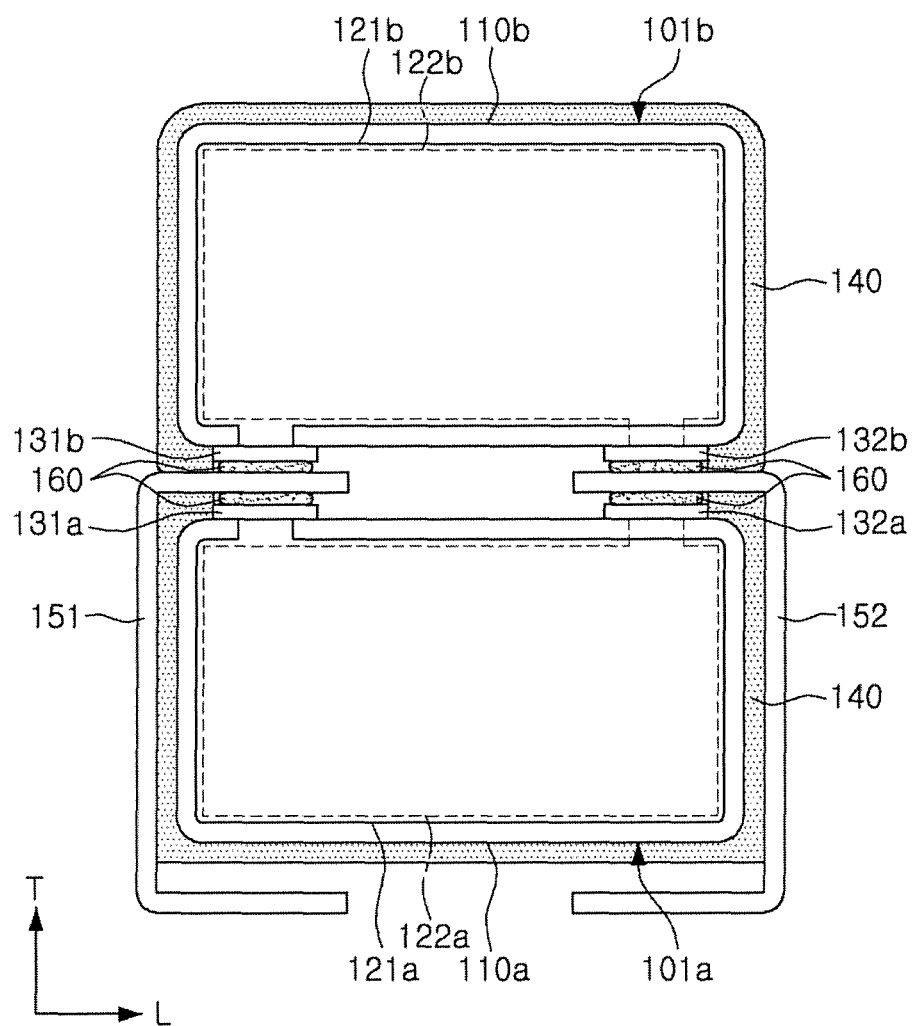
FIG. 10 is a cross-sectional view of a surface mounted electronic component according to a fifth modified exemplary embodiment in the present disclosure.

FIG. 10 is a cross-sectional view of a surface mounted electronic component according to a fifth modified exemplary embodiment.

As illustrated in FIG. 10, the surface mounted electronic component, according to the present modified exemplary embodiment, may further include a molding part 140 enclosing first and second electronic components 101a and 101b.

The molding part 140 may be formed of an insulating material and contain, for example, an epoxy resin.

When first and second electronic components are enclosed by a molding part as in the present modified exemplary embodiment, infiltration of moisture and water into the first and second electronic components may be prevented, and adhesive strength between the first and second electronic components 101a and 101b and frame terminals 151 and 152 may be increased.

In this case, end surface frames and lower surface frames of the first and second frame terminals 151 and 152 may be disposed outside of the molding part 140 to thereby be externally electrically connected.

Figure 11A:
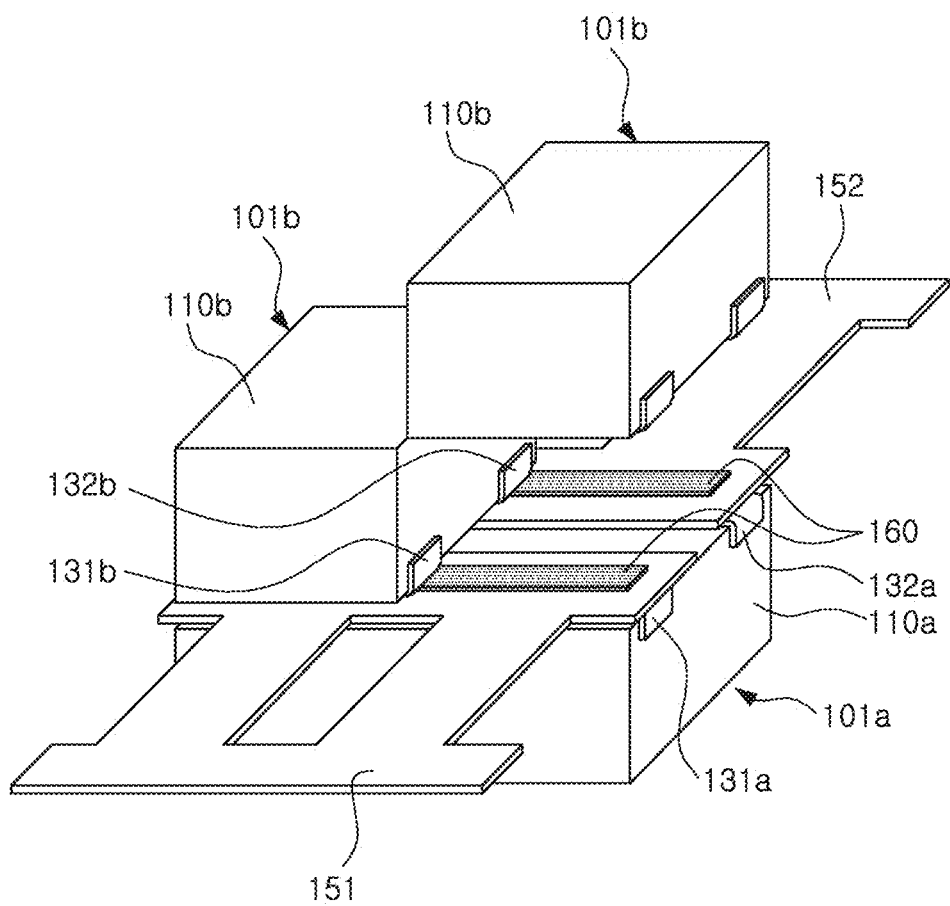
FIGS. 11A through 11C are perspective views schematically illustrating a surface mounted electronic component according to a sixth modified exemplary embodiment in the present disclosure and a manufacturing method thereof.
Figure 11B:
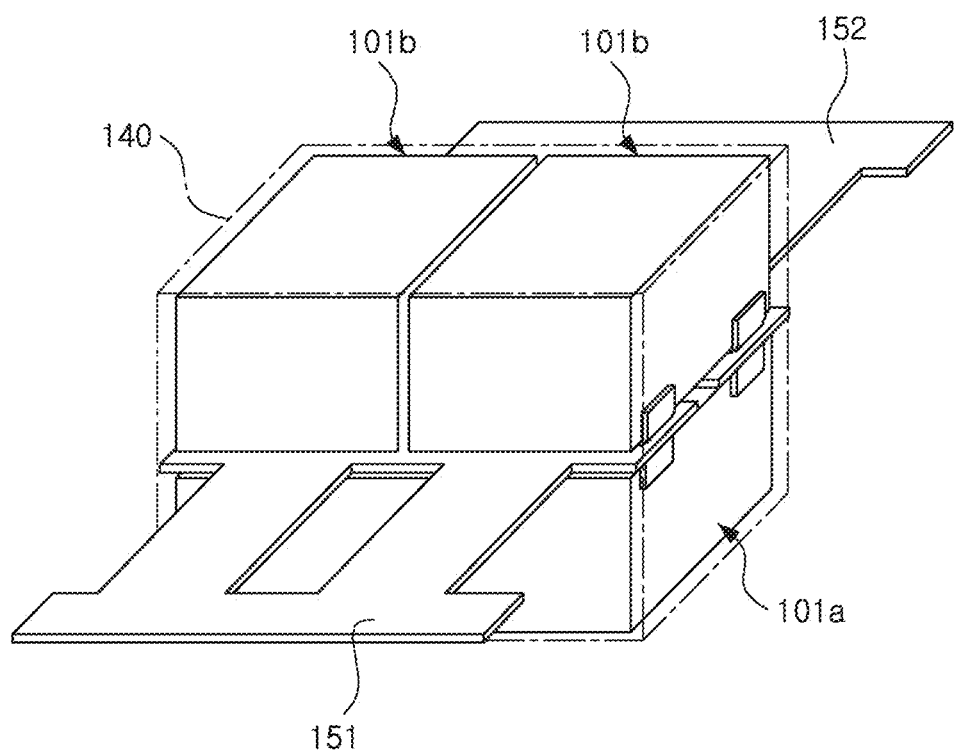
Figure 11C:
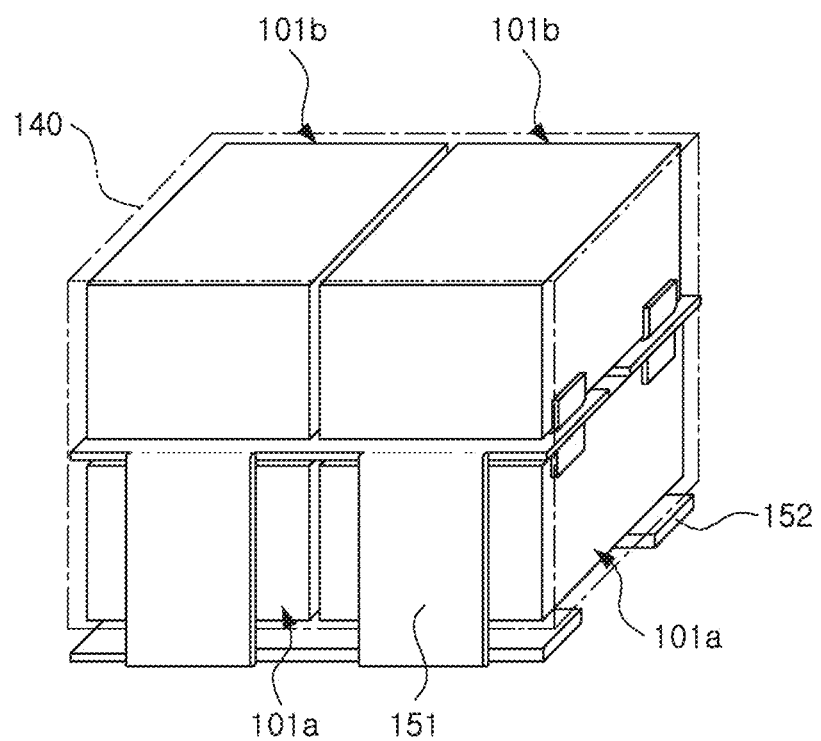

FIGS. 11A through 11C are perspective views schematically illustrating a surface mounted electronic component according to a sixth modified exemplary embodiment and a manufacturing method thereof.

As illustrated in FIGS. 11A through 11C, the surface mounted electronic component, according to the sixth modified exemplary embodiment, may include a plurality of first and second electronic components 101a and 101b, wherein each of the electronic components may be disposed in parallel.

First, as illustrated in FIG. 11A, the plurality of first and second electronic components 101a and 101b may be disposed on and below frame terminals, respectively, with first ends of flat-shaped frame terminals 151 and 152 interposed therebetween.

Next, as illustrated in FIG. 11B, after a molding part 140 is formed to enclose the first and second electronic components, the frame terminals 151 and 152 may be bent twice, and thus the surface mounted electronic component having a shape illustrated in FIG. 11C may be formed.

Figure 12A:
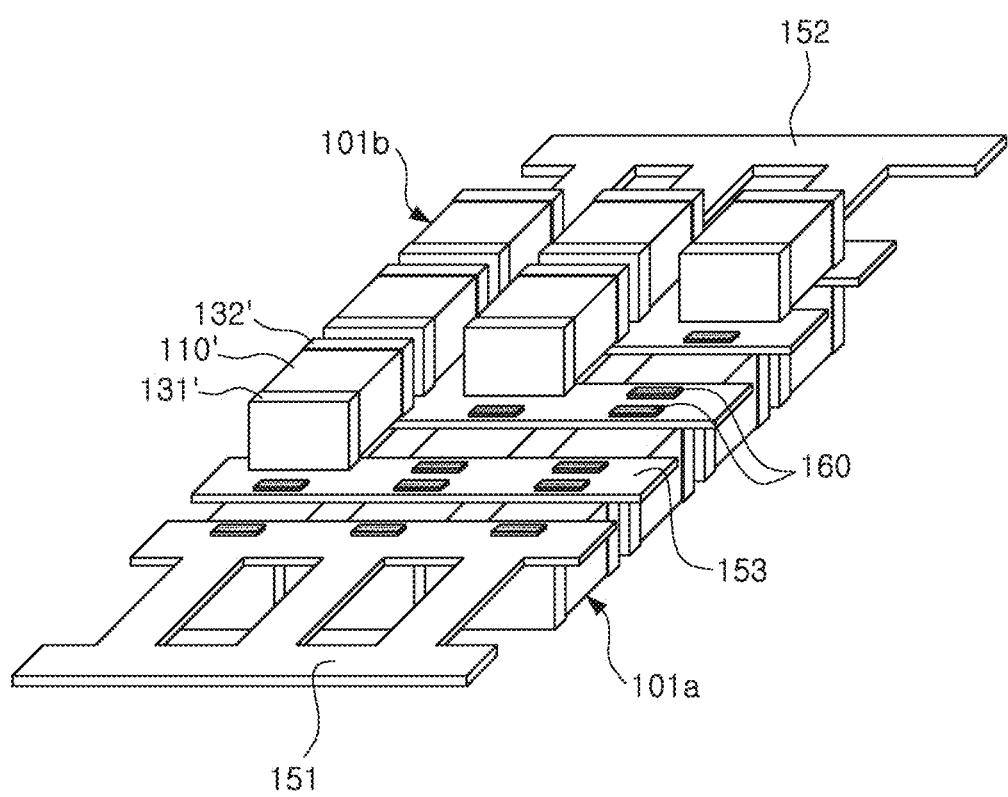
FIGS. 12A through 12C are perspective views schematically illustrating a surface mounted electronic component according to a seventh modified exemplary embodiment in the present disclosure and a manufacturing method thereof.
Figure 12B:
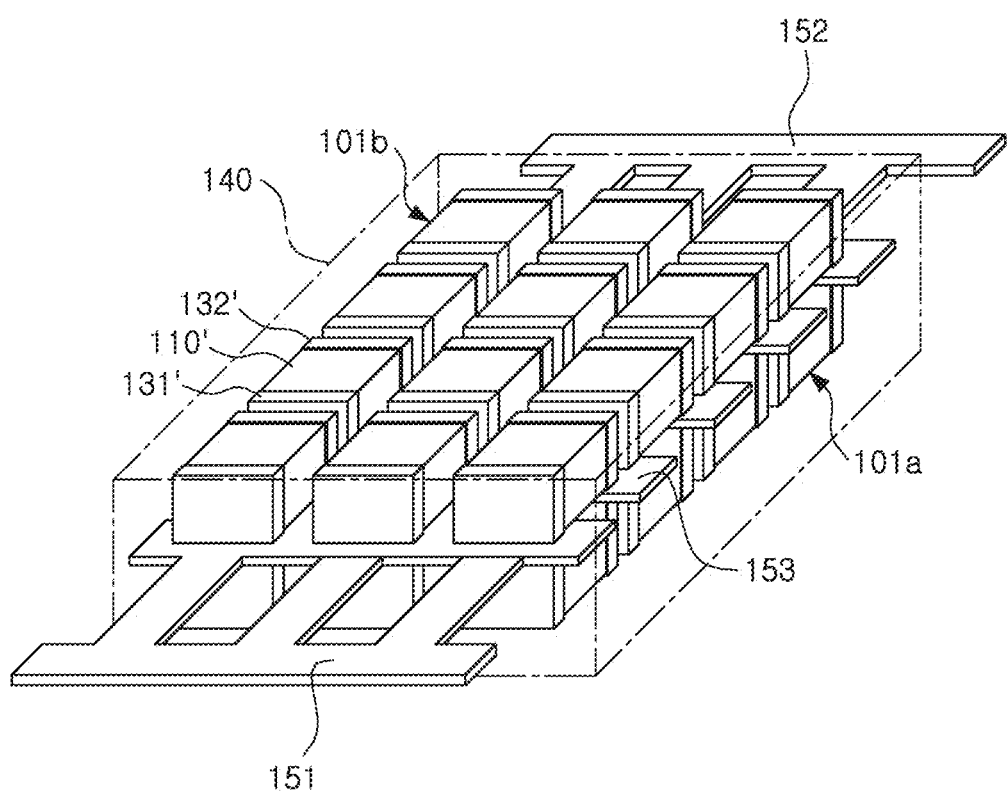
Figure 12C:
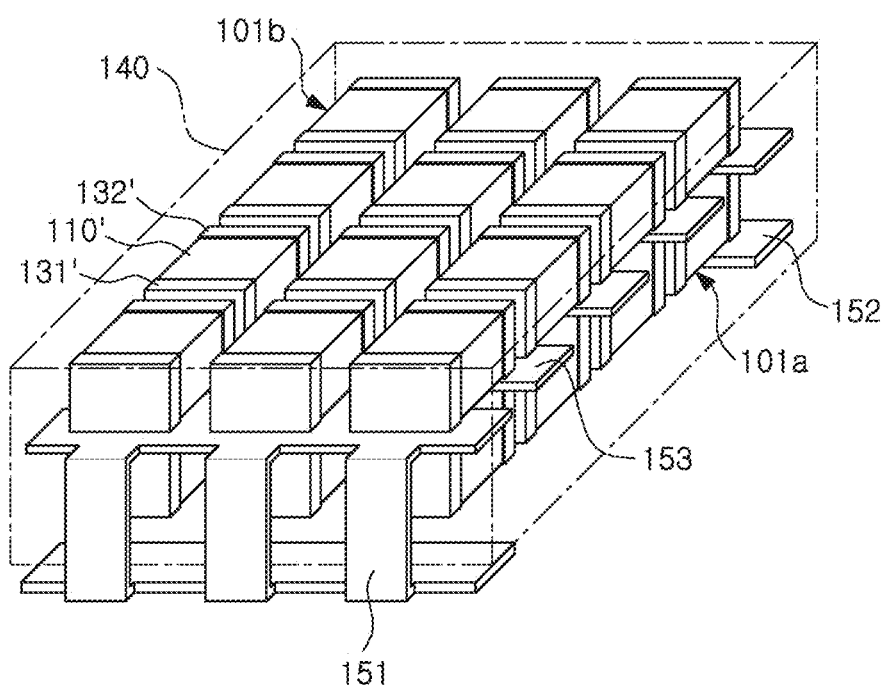

FIGS. 12A through 12C are perspective views schematically illustrating a surface mounted electronic component according to a seventh modified exemplary embodiment and a manufacturing method thereof.

As illustrated in FIGS. 12A through 12C, the surface mounted electronic component, according to the seventh modified exemplary embodiment, may include a plurality of first and second electronic components 101a and 101b, wherein each of the electronic components may be disposed in series and in parallel.

As illustrated in FIGS. 12A through 12C, connection frames 153 may be additionally disposed between the electronic components disposed in series.

Board 200 Having Electronic component

According to an exemplary embodiment, boards on which the surface mounted electronic component according to the exemplary embodiment and the surface mounted electronic components according to the first to seventh modified exemplary embodiments described above are mounted on circuit boards, respectively, may be provided.

Figure 13:
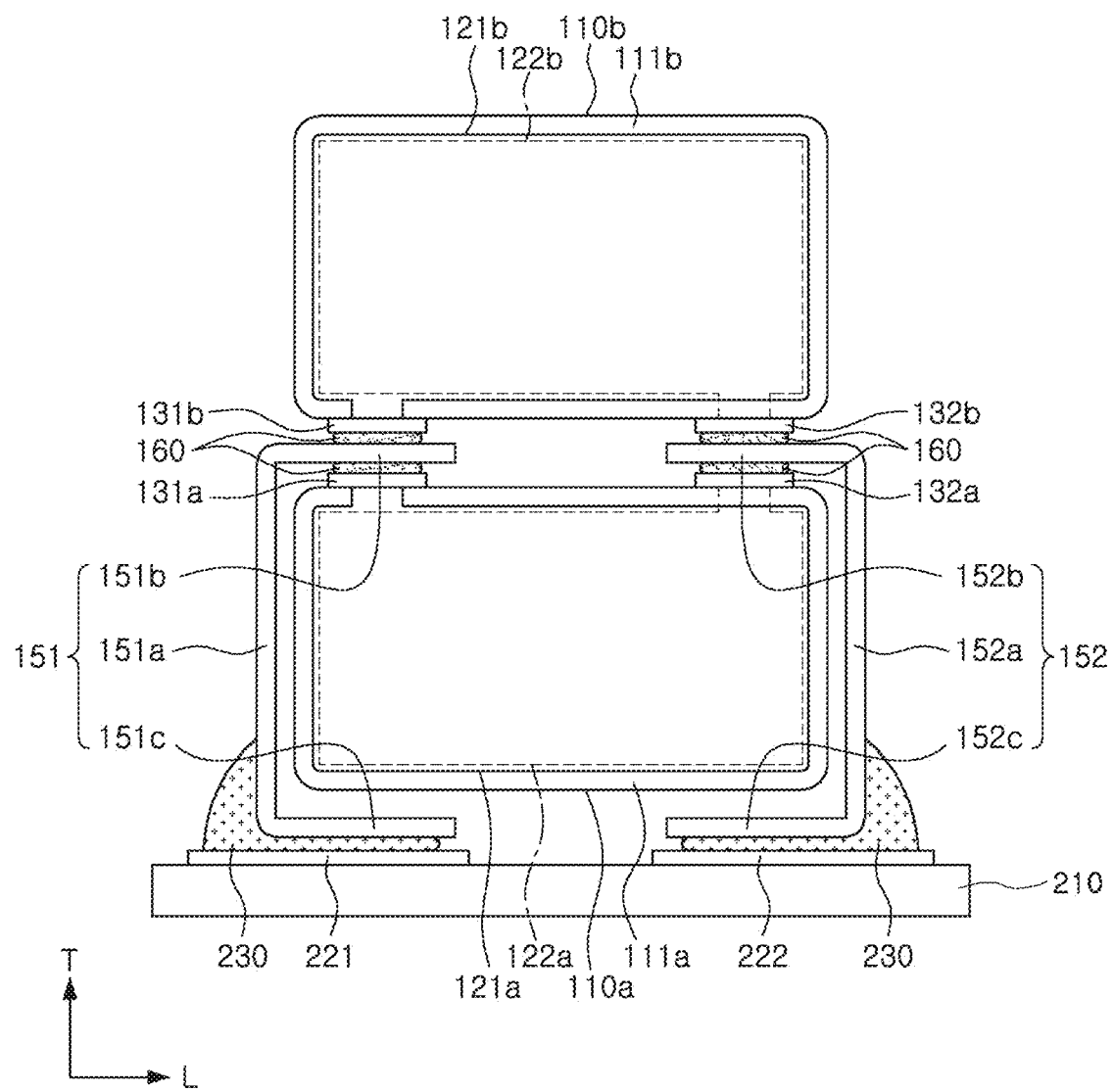
FIG. 13 is a cross-sectional view illustrating a circuit board on which the surface mounted electronic component according to the exemplary embodiment in the present disclosure is mounted.

FIG. 13 is a cross-sectional view illustrating the board on which the surface mounted electronic component, according to the exemplary embodiment, is mounted on the circuit board.

Referring to FIG. 13, the board 200 having an electronic component according to the present exemplary embodiment may include: a circuit board 210 on which first and second electrode pads 221 and 222 are provided; and a surface mounted electronic component 100 mounted on the circuit board 210.

In this case, the surface mounted electronic component 100 may be electrically connected to the circuit board 210 by solders 230 in a state in which first and second frame terminals 151 and 152 are positioned to contact the first and second electrode pads 221 and 222, respectively.

A description of the same contents of the board having an electronic component as those of the above-mentioned surface mounted electronic component will be omitted in order to avoid an overlapping description.

As set forth above, according to an exemplary embodiment, the frame terminals may absorb external mechanical stress to prevent the electronic components from being damaged, and since heat generated in the electronic components may be radiated through the frame terminal, an increase in temperature in the electronic components may be suppressed, and reliability may be improved.

Further, the electronic components may be perpendicularly disposed, and thus the surface mounted electronic component may be miniaturized and capacitance may be improved.

While exemplary embodiments have been shown and described above, it will be apparent to those skilled in the art that modifications and variations could be made without departing from the scope of the present inventive concept as defined by the appended claims.

What is claimed is:
1. A surface mounted electronic component comprising:
a first frame terminal including a first end surface frame extending in a first direction and first upper and lower surface frames extending from upper and lower ends of the first end surface frame in a second direction;
a second frame terminal including a second end surface frame opposing the first end surface frame and extending in the first direction and second upper and lower surface frames extending from upper and lower ends of the second end surface frame in a third direction opposite to the second direction;
a first electronic component disposed between the first and second end surface frames below the first and second upper surface frames; and
a second electronic component disposed above the first and second upper surface frames, such that the first and second end surface frames do not extend in the first direction to overlap a surface of the second electronic component, wherein the first and second frame terminals each have a vertically symmetric structure, such that the first upper and lower surface frames extend the same distance in the second direction, and the second upper and lower surface frames extend the same distance in the third direction; wherein the first and second electronic components each have a first and a second external electrodes; and wherein the first external electrode of the first electronic component is electrically connected to the first upper surface frame, and the second frame terminal is configured to enable disposing a third electronic component adjacent the first electronic component, wherein a connection frame electrically connects the second external electrode of the first electronic component with a first external electrode of the third electronic component, a second external electrode of the third electronic component being connected to the second frame terminal such that the first electronic component and the third electronic component are electrically in series.

2. The surface mounted electronic component of claim 1, wherein the first and second external electrodes of the first and second electronic components are electrically connected to the first or second upper surface frame.

3. The surface mounted electronic component of claim 2, wherein the first and second external electrodes of the first and second electronic components are electrically connected to the first or second upper surface frame through a conductive adhesive.

4. The surface mounted electronic component of claim 1, wherein the first and second electronic components each include ceramic bodies in which dielectric layers and internal electrodes are alternately stacked, and the first and second external electrodes disposed on outer surfaces of the ceramic bodies and connected to the internal electrodes,
the internal electrodes of the first and second electronic components being disposed perpendicularly to a mounting surface.

5. The surface mounted electronic component of claim 4, wherein the internal electrodes of the first electronic component extend to an upper surface of the ceramic body, and the internal electrodes of the second electronic component extend to a lower surface of the ceramic body.

6. The surface mounted electronic component of claim 1, wherein the first and second electronic components each include ceramic bodies in which dielectric layers and internal electrodes are alternately stacked, and the first and second external electrodes disposed on outer surfaces of the ceramic bodies and connected to the internal electrodes,
the internal electrodes of the first and second electronic components being disposed in parallel with a mounting surface.

7. The surface mounted electronic component of claim 1, wherein the first and second electronic components each include ceramic bodies in which dielectric layers and internal electrodes are alternately stacked, and the first and second external electrodes disposed on outer surfaces of the ceramic bodies and connected to the internal electrodes,
the internal electrodes of the first electronic component being disposed perpendicularly to a mounting surface and the internal electrodes of the second electronic component being disposed in parallel with the mounting surface.

8. The surface mounted electronic component of claim 7, wherein the internal electrodes of the first electronic component extend to an upper surface of the ceramic body.

9. The surface mounted electronic component of claim 4, wherein the first and second external electrodes of the first electronic component are connected to the internal electrodes on an upper surface of the ceramic body.

10. The surface mounted electronic component of claim 1, further comprising a molding part enclosing the first and second electronic components.

11. The surface mounted electronic component of claim 1, wherein the first and second electronic components are provided in plural.

12. The surface mounted electronic component of claim 11, wherein a plurality of the first electronic components are connected to each other in parallel.

13. A surface mounted electronic component comprising:
a first electronic component;
a second electronic component disposed above the first electronic component; and
a pair of frame terminals connected to the first and second electronic components,
wherein first ends of the pair of frame terminals are disposed between the first and second electronic components, second ends of the pair of frame terminals are disposed below the first electronic component,
an entirety of the second electronic component is disposed above the pair of frame terminals, and
wherein the pair of frame terminals each have a vertically symmetric structure, such that the first upper and lower surface frames extend the same distance a first direction, and the second upper and lower surface frames extend the same distance in a second direction;
and wherein a first external electrode of the first electronic component is electrically connected to the first upper surface frame, and the second frame terminal is configured to enable disposing a third electronic component adjacent the first electronic component, wherein a connection frame electrically connects a second external electrode of the first electronic component with a first external electrode of the third electronic component, a second external electrode of the third electronic component being connected to the second frame terminal such that the first electronic component and the third electronic component are electrically in series.

* * * * *